US012560658B2

(12) United States Patent
Kim et al.

(10) Patent No.: US 12,560,658 B2
(45) Date of Patent: Feb. 24, 2026

(54) DEVICE AND METHOD FOR DETECTING DETERIORATED BATTERY CELL

(71) Applicant: LG ENERGY SOLUTION, LTD., Seoul (KR)

(72) Inventors: Soon Jong Kim, Daejeon (KR); Jeong Bin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/289,337

(22) PCT Filed: Jan. 3, 2023

(86) PCT No.: PCT/KR2023/000087
§ 371 (c)(1),
(2) Date: Nov. 2, 2023

(87) PCT Pub. No.: WO2023/132602
PCT Pub. Date: Jul. 13, 2023

(65) Prior Publication Data
US 2024/0337701 A1     Oct. 10, 2024

(30) Foreign Application Priority Data
Jan. 6, 2022     (KR) ........................ 10-2022-0002013

(51) Int. Cl.
*G01R 31/392*     (2019.01)
*G01R 19/00*     (2006.01)
(Continued)

(52) U.S. Cl.
CPC ......... *G01R 31/392* (2019.01); *G01R 19/003* (2013.01); *G01R 19/10* (2013.01);
(Continued)

(58) Field of Classification Search
None
See application file for complete search history.

(56) References Cited

U.S. PATENT DOCUMENTS 7,362,074 B2     4/2008 Iwane et al.
8,140,280 B2 *   3/2012 Kasai ................... B62D 5/0481
                                          702/182
(Continued)

FOREIGN PATENT DOCUMENTS

CN     102906582 A     1/2013
CN     110780226 B     12/2021
(Continued)

OTHER PUBLICATIONS

International Search Report (PCT/ISA/210) issued in PCT/KR2023/000087 mailed on Apr. 3, 2023.
(Continued)

*Primary Examiner* — Raymond L Nimox
(74) *Attorney, Agent, or Firm* — Birch, Stewart, Kolasch & Birch, LLP

(57)     ABSTRACT
The present invention discloses an apparatus and method for detecting a deteriorated battery cell including a measurement unit that measures a state of a battery, an estimation unit that estimates a state of health (SOH) of the battery, a diagnosis setting unit that sets a diagnosis start condition, a diagnosis section, and a determination condition of the deteriorated battery cell according to the SOH of the battery, a diagnosis performance decision unit that determines a detection performance condition of the deteriorated battery cell after an end of charging/discharging of the battery, and a deterioration determination unit that determines the deteriorated battery cell by calculating a voltage difference in the charging and discharging end section and comparing the measurement value with a set value.

18 Claims, 5 Drawing Sheets

(51) Int. Cl.

| | | |
|---|---|---|
| *G01R 19/10* | (2006.01) |
| *G01R 19/30* | (2006.01) |
| *G01R 31/367* | (2019.01) |
| *G01R 31/3842* | (2019.01) |
| *G01R 31/396* | (2019.01) |

(52) U.S. Cl.

CPC ........... *G01R 19/30* (2013.01); *G01R 31/367* (2019.01); *G01R 31/3842* (2019.01); *G01R 31/396* (2019.01)

(56) References Cited

U.S. PATENT DOCUMENTS

| | | | | |
|---|---|---|---|---|
| 2012/0274281 A1* | 11/2012 | Kim | ..................... | G01R 31/392 |
| | | | | 320/112 |
| 2013/0278221 A1* | 10/2013 | Maeda | ................. | G01R 31/392 |
| | | | | 320/134 |
| 2016/0003917 A1* | 1/2016 | You | ..................... | G01R 31/367 |
| | | | | 702/63 |
| 2019/0195956 A1* | 6/2019 | Lim | .................. | H01M 10/4207 |
| 2023/0020146 A1* | 1/2023 | Mizoguchi | ............. | H02J 7/005 |

FOREIGN PATENT DOCUMENTS

| | | | |
|---|---|---|---|
| JP | 2004-31120 A | 1/2004 |
| JP | 2006-138750 A | 6/2006 |
| JP | 2008-39526 A | 2/2008 |
| JP | 2014-522491 A | 9/2014 |
| JP | 2016-102674 A | 6/2016 |
| JP | 2018-164323 A | 10/2018 |
| JP | 2019-50168 A | 3/2019 |
| JP | 2020-520461 A | 7/2020 |
| JP | 2020-169943 A | 10/2020 |
| JP | 2021-92404 A | 6/2021 |
| KR | 10-0387491 B1 | 6/2003 |
| KR | 10-0911317 B1 | 8/2009 |
| KR | 10-2012-0076068 A | 7/2012 |
| KR | 10-2016-0004077 A | 1/2016 |
| KR | 10-2019-0075684 A | 7/2019 |
| KR | 10-2079875 B1 | 2/2020 |
| KR | 10207875 B1 * | 2/2020 |
| KR | 10-2021-0131783 A | 11/2021 |
| KR | 102370105 B1 * | 3/2022 |

OTHER PUBLICATIONS

Extended European Search Report for European Application No. 23737350.1, dated Sep. 24, 2024.

* cited by examiner

DEVICE AND METHOD FOR DETECTING DETERIORATED BATTERY CELL

TECHNICAL FIELD

The present invention relates to an apparatus and method for detecting a deteriorated battery cell, and more particularly, to an apparatus and method for detecting a deteriorated battery cell by using data at the end time point of charging and discharging when a voltage difference increases.

BACKGROUND ART

A secondary battery that can be charged or discharged, that is, a battery, is widely used as an energy source for a mobile device such as a smartphone. In addition, the battery is also used as an energy source for eco-friendly vehicles such as an electric vehicle and a hybrid electric vehicle, which are proposed as a solution to air pollution caused by a gasoline vehicle and diesel vehicle using fossil fuels. The types of applications using the battery are becoming very diverse, and in the future, it is expected that the battery will be applied to more fields and products than now.

Currently, commercially available batteries include a nickel cadmium battery, a nickel hydrogen battery, a nickel zinc battery, and a lithium ion battery. Among the batteries, since the lithium ion battery has almost no memory effect compared to the nickel-based batteries, the lithium ion battery is being spotlighted because of its advantage of free charging/discharging, very low self-discharge rate, and high energy density. In addition, since the lithium ion battery can be manufactured in a small size and light weight, it is used as a power source for the mobile device, and is attracting attention as a next-generation energy storage medium, as its usage range is expanded as a power source for the electric vehicle.

As described above, the battery is used in various fields, and fields in which the battery is frequently used recently, such as the electric vehicle and a smart grid system, often require large capacities. In order to increase the capacity of the battery, the capacity of the battery cell itself can be increased. However, in this case, a capacity increase effect is not great, there is a physical limit to size expansion of the battery, and it has disadvantages that management is inconvenient. Therefore, a battery pack in which a plurality of battery cells are connected in series and/or in parallel is commonly used.

By the way, as charging/discharging of the battery is repeated, that is, as the usage time increases, a voltage difference between battery modules or battery cells occurs. The cause of the voltage difference may include a difference in capacity or internal resistance between battery cells, a difference in operating temperature due to arrangement of the cells, etc. An imbalance occurs in the battery cell voltage due to a state of charging, degree of degradation, and manufacturing. As such an imbalance is maintained, not only the available capacity of the battery decreases, but also degradation due to the imbalance is accelerated. This deterioration in performance is referred to as deterioration of the battery cell, and it is necessary to replace the deteriorated battery cell based on a certain degree of deterioration so as not to adversely affect the entire battery module.

Therefore, it is necessary to measure the degree of deterioration of the battery cell or battery module. Conventionally, in a battery management system, the deterioration is determined based on a resistance change rate of the battery cell, or life of the battery is predicted based on a current and voltage of the battery cell.

On the other hand, Korean patent registration No. 10-2079875 (hereinafter referred to as prior literature) discloses an apparatus and method for detecting a deterioration module or deterioration cell of a battery that can analyze a location of the deteriorated cell in a battery cell or battery module unit in consideration of operation history data in a battery system or energy storage device. In the prior literature, the voltage, location, and current data are acquired and analyzed in units of days, months, and years, and the minimum VMin, maximum VMax, and average VAvg of voltage are calculated for each charging, discharging, stop (standby) operation condition to determine whether VMax (N)−VAvg (N)>V_Set_Chg condition is satisfied during charging operation, determine whether VAvg (N)−VMin (N)>V_Set_DChg condition is satisfied during discharging operation, and determine whether VMax (N)−VMin (N)>V_Set_DeV condition is satisfied during stop operation to thereby determine the deterioration.

By the way, if the minimum VMin, maximum VMax, and average VAvg of the voltage are calculated on a daily, monthly, and yearly basis as in the prior literature, the minimum VMin and maximum VMax of the voltage are calculated based on the day when the highest charge SOC was used and the day when the lowest discharge SOC was used. Therefore, the prior literature has a problem of not sufficiently reflecting a voltage change during the calculation period. In addition, when the minimum VMin, maximum VMax, and average VAvg of voltage are calculated on a daily, monthly, and yearly basis, and the difference between the minimum VMin, maximum VMax, and average VAvg of voltage in units of period is used as a detection reference for the deteriorated cell, since the deterioration cell detection reference is determined based only on a simple voltage difference, it is difficult to determine whether the difference is natural due to degradation the battery or a difference caused by defective factors such as manufacturing, installation, and use of the battery. Therefore, it is necessary to review the detected result to determine deterioration. In addition, when calculating the difference in the entire battery operation period, data acquired every second should be calculated, and thus an amount of computation is large. When the corresponding apparatus for detecting the deteriorated cell is operated in a battery system, as the amount of computation increases, unnecessary energy is consumed, and thus available energy of the battery is reduced.

As related prior art, there is the following document.
Korean patent registration No. 10-2079875

DISCLOSURE OF THE INVENTION

Technical Problem

The present invention provides an apparatus and method for detecting a deteriorated battery cell capable of sufficiently reflecting a voltage change during a calculation period to detect the deteriorated battery cell.

As the cell voltage imbalance is maintained, not only the available capacity of the battery decreases but also the deterioration due to the imbalance is accelerated, and accordingly, the present invention provides an apparatus and method for detecting a deteriorated battery cell capable of detecting this.

The present invention provides an apparatus and method for detecting a deteriorated battery cell capable of detecting the deteriorated battery cell using data at the end time point of charging and discharging by paying attention to a phenomenon in which the voltage difference at the end time point of charging and discharging is increased.

Technical Solution

An apparatus for detecting a deteriorated battery cell according to an embodiment of the present invention includes a measurement unit that measures a state of a battery including a plurality of battery cells, an estimation unit that estimates a state of health (SOH) of the battery, a diagnosis setting unit that sets a diagnosis start condition, a diagnosis section, and a deterioration determination condition of each battery cell according to the SOH of the battery, a diagnosis performance decision unit that decides whether or not to perform a diagnosis by determining whether or not the diagnosis start condition of each battery cell is satisfied after an end of charging/discharging of the battery, and a deterioration determination unit that determines a deteriorated battery cell among the plurality of battery cells by calculating a voltage difference in the diagnosis section after the end of the charging/discharging and comparing the voltage difference with the deterioration determination condition.

A storage unit that stores data including the diagnosis start condition, the diagnosis section, and the deterioration determination condition of each battery cell.

The diagnosis setting unit includes a diagnosis start condition setting unit that sets the diagnosis start condition of each battery cell according to the SOH of the battery, a diagnosis section setting unit that sets the diagnosis section of each battery cell, and a deterioration condition setting unit that sets the deterioration determination condition of each battery cell according to the SOH of the battery.

The diagnosis start condition setting unit sets a first and second start conditions of charging and discharging sections according to the SOH of the battery, the first start condition of the charging section is charging for a charging operation time or more, the second start condition thereof is charging for a charging depth of discharge (DOD) or more, and the first start condition of the discharging section is discharging for a discharging operation time or more, and the second start condition is discharging for a discharging DOD or more.

The diagnosis section setting unit, when a current measurement value is less than or equal to a predetermined current limit value, sets a charging detection time reference value time point after the end of charging from a charging end time point as a charging detection reference value and sets a discharging detection time reference value time point after the end of discharging from a discharging end time point as a discharging detection reference value.

The deterioration condition setting unit sets the deterioration determination condition of the deteriorated battery cell using a maximum value VMax of voltage, a minimum value VMin of voltage, and an average value VAvg of voltage calculated during the diagnosis section.

The deterioration condition setting unit sets first and second diagnosis reference values in a charging detection section reference value and a discharging detection section reference value, the first diagnosis reference value is a difference (VAvg-VMin) between the average voltage VAvg within the battery and the minimum voltage VMin within the battery, and the second diagnosis reference value is a difference (VMax-VAvg) between the maximum voltage VMax within the battery and the average voltage VAvg within the battery.

The diagnosis performance decision unit decides to perform the diagnosis when it is charged for the charging operation time or more or charged for the charging DOD or more in the charging section, and decides to perform the diagnosis when it is discharged for the discharging operation time or more or the discharging DOD or more in the discharging section.

The deterioration determination unit determines the deteriorated battery cell when the voltage difference in the charging detection reference value is greater than the difference between the average value VAvg of voltage within the battery and the minimum value VMin of voltage within the battery or greater than the difference between the maximum value VMax of voltage within the battery and the average value VAvg of voltage within the battery.

The deterioration determination unit determines the deteriorated battery cell when the voltage difference in the discharging detection reference value is greater than the difference between the average value VAvg of voltage within the module and the minimum value VMin of voltage within the battery or greater than the difference between the maximum value VMax of voltage within the battery and the average value VAvg of voltage within the battery.

A method for detecting a deteriorated battery cell of the present invention includes a process of measuring a state of a battery including a plurality of battery cells, a process of estimating a state of health (SOH) of the battery, a process of setting a diagnosis start condition, a diagnosis section, and a deterioration determination condition of each battery cell according to the SOH of the battery, a process of determining a detection diagnosis performance condition of each battery cell, and a process of determining a deteriorated battery cell among the plurality of battery cells by calculating a voltage difference in the diagnosis section and comparing the voltage difference with the deterioration determination condition.

A process of storing data including the diagnosis start condition, the diagnosis section, and the deterioration determination condition of the deteriorated battery cell is further included.

In the process of setting the diagnosis start condition of the battery, first and second start conditions of charging and discharging sections are set according to the SOH of the battery, the first start condition of the charging section is charging for a charging operation time or more and the second start condition thereof is charging for a charging DOD or more, and the first start condition of the discharging section is discharging for a discharging operation time or more and the second start condition is discharging for a discharging DOD or more.

In the process of setting the diagnosis section, when a current measurement value is less than or equal to a predetermined current limit value, a charging detection time reference value time point after the end of charging from a charging end time point is set as a charging detection reference value and a discharging detection time reference value time point after the end of discharging from a discharging end time point is set as a discharging detection reference value.

In the process of setting the deterioration condition, first and second diagnosis reference values are set in a charging detection section reference value and a discharging detection section reference value, the first diagnosis reference value is a difference (VAvg–VMin) between an average voltage VAvg within a battery and a minimum voltage VMin within the battery, and the second diagnosis reference value is a difference (VMax–VAvg) between a maximum voltage VMax within the battery and the average voltage VAvg within the battery.

In the process of determining the detection diagnosis performance condition, it is decided to perform a diagnosis when it is charged for the charging operation time or more or charged for the charging DOD or more in the charging section, and it is decided to perform the diagnosis when it is discharged for the discharging operation time or more or the discharging DOD or more in the discharging section.

In the process of determining the deteriorated battery cell, the corresponding battery cell is determined as the deteriorated battery cell when the voltage difference in the charging detection reference value is greater than the difference between the average value VAvg of voltage within the battery and the minimum value VMin of voltage within the battery or greater than the difference between the maximum value VMax of voltage within the battery and the average value VAvg of voltage within the battery.

In the process of determining the deteriorated battery cell, the corresponding battery cell is determined as the deteriorated battery cell when the voltage difference in the discharging detection reference value is greater than the difference between the average value VAvg of voltage within the battery and the minimum value VMin of voltage within the battery or greater than the difference between the maximum value VMax of voltage within the battery and the average value VAvg of voltage within the battery.

Advantageous Effects

Generally, when the charging/discharging time is short or the depth of discharging (DOD) is small, the voltage difference between cells does not occur significantly because the battery usage is not large, but as the battery degrades, the degradation difference (differences in internal resistance and capacity reduction) between the cells in a module appears, and due to this degradation difference, a voltage difference occurs during charging/discharging.

Such a voltage difference is particularly large at the end time point of charging/discharging, and, in the present invention, a deteriorated battery cell is detected by paying attention to the phenomenon in which the voltage difference increases at the end time point of charging and discharging. The degree of degradation of the battery cell voltage difference is different depending on the lifespan (degree of deterioration) of the battery even when charging/discharging is performed under the same conditions. In other words, difference also occur depending on the specifications of battery cell products, pack configuration, and battery application. Therefore, in the present invention, the deteriorates cell is detected based on a cell voltage difference in the same group (system, module) based on a battery SOH (lifespan). That is, in the present invention, the deteriorated battery cell is determined by comparing the measured value during a time from the charging/discharging end time point to the charging/discharging detection time reference value time point after the end of charging/discharging with the set value. Therefore, in the present invention, it is possible to solve the problem that the prior literature in which statistics are produced for all measured values and all measured values are compared on a daily/monthly/yearly basis does not sufficiently reflect the voltage change during the calculation period.

That is, the present invention has an effect of minimizing computations for detecting the deteriorated cell by setting a deteriorated battery cell/module detection operating condition according to conditions (whether it is charged/discharged, battery usage, battery lifespan (SOH)) that can cause a large voltage difference so that a deteriorated cell detection diagnosis is performed only when the battery satisfies a specific use condition. In addition, in the present invention, the deteriorated module or cell reference differently is set according to the usage conditions and lifespan of the battery, so that it is possible to distinguish whether the difference is normal due to battery degradation or a difference due to a battery defect factor. Accordingly, the present invention has the effect of minimizing additional review in determining deterioration from the detection result.

MODE FOR CARRYING OUT THE INVENTION

Figure 1:
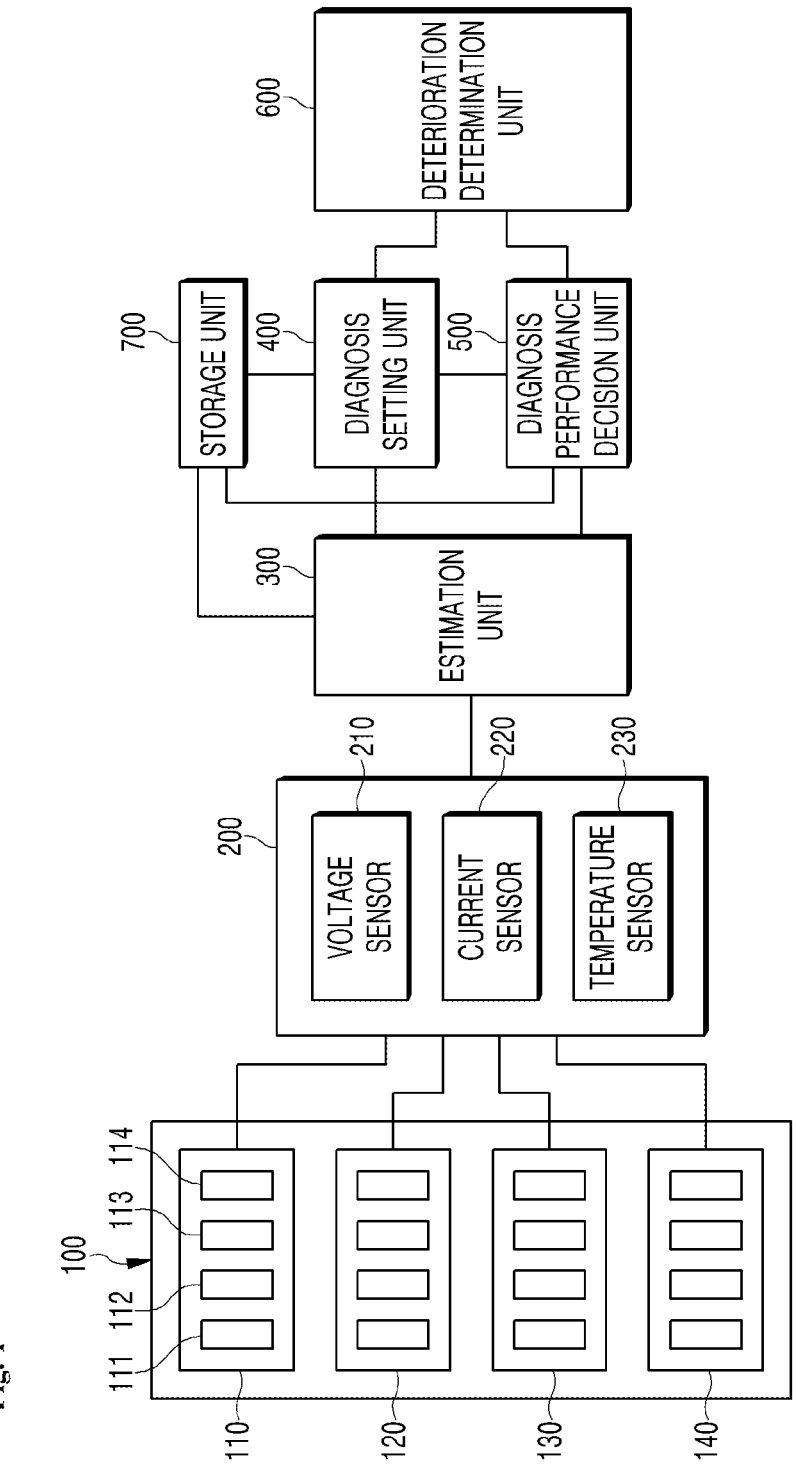
FIG. 1 is a block diagram for describing a configuration of an apparatus for detecting a deteriorated battery cell according to an embodiment of the present invention.

Hereinafter, embodiments of the present invention will be described in detail with reference to the accompanying drawings. However, the present invention is not limited to the embodiments disclosed below, but will be implemented in a variety of different forms. Only the embodiments are provided to complete the disclosure of the present invention and to fully inform those skilled in the art of the scope of the invention. In order to clearly express the various layers and each region in the drawing, the thickness is enlarged and expressed, and the same reference number in the drawing refer to the same elements.

Figure 2:
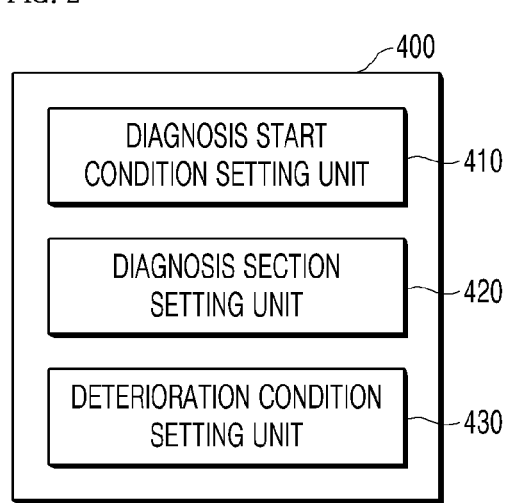
FIG. 2 is a block diagram illustrating a configuration of a diagnosis setting unit of the apparatus for detecting the deteriorated battery cell according to the embodiment of the present invention.

FIG. 1 is a block diagram for describing a configuration of an apparatus for detecting a deteriorated battery cell according to an embodiment of the present invention. FIG. 2 is a block diagram illustrating a configuration of a diagnosis setting unit of the apparatus for detecting the deteriorated battery cell according to the embodiment of the present invention.

Referring to FIG. 1, the apparatus for detecting the deteriorated battery cell according to the embodiment of the present invention may include a battery 100 including at least two or more battery cells 111, 112, 113, and 114 capable of being charged/discharged, a measurement unit 200 that measures a state of the battery 100, such as a voltage, a current, and a temperature, an estimation unit 300 that estimates a state of health (SOH) of the battery 100, a diagnosis setting unit 400 that sets a diagnosis start condition and a diagnosis section according to the SOH of the battery 100 and sets a determination condition of the deteriorated battery cell, a diagnosis performance decision unit 500 that determines whether or not a detection diagnosis start condition of the deteriorated battery cell after the end of charging/discharging. a deterioration determination unit 600 that determines the deteriorated battery cell by comparing a measured value in a charging/discharging end section with a set value of a detection condition. In addition, a storage unit 700 that stores data such as the detection condition of the deteriorated battery cell may be further included. In the present invention, a battery module including the deteriorated battery cell may be determined as a deteriorated battery module. The apparatus for detecting the deteriorated battery cell according to the embodiment of the present invention will be described in more detail for each configuration as follows 1. Battery The battery 100 can be charged and discharged to provide energy necessary for driving electrical and electronic devices. That is, the battery 100 may be charged to store electrical energy of predetermined capacity and discharged to provide electrical energy for an operation of the electric and electronic devices. The battery 100 may include at least one battery pack 110, 120, 130, and 140. Each of the battery packs 110, 120, 130, and 140 may include a plurality of battery cells 111, 112, 113, and 114 capable of being charged/discharged. That is, it may include the plurality of battery cells 111, 112, 113, and 114, the plurality of battery cells 111, 112, 113, and 114 may be bundled in a predetermined unit to form the battery packs 110, 120, 130, and 140, and a plurality of battery packs 110, 120, 130, and 140 may form one battery 100. The plurality of battery cells 111, 112, 113, and 114 may be connected in series and/or in parallel in various ways to meet specifications of the electrical and electronic devices. Of course, the plurality of battery packs 110, 120, 130, and 140 each including the plurality of battery cells 111, 112, 113, and 114 may also be connected in series and/or parallel. In addition, each of the plurality of battery packs 110, 120, 130, and 140 may include the same number of battery cells 111, 112, 113, and 114, and each of the battery cells 111, 112, 113, and 114 may have the same performance, such as the same capacity and the same voltage. That is, each of the plurality of battery packs 110, 120, 130, and 140 may have the same performance. Here, the types of the battery cell are not particularly limited, and may include, for example, a lithium ion battery, a lithium polymer battery, a nickel cadmium battery, a nickel hydride battery, a nickel zinc battery, etc. Meanwhile, in the present invention, at least one of the plurality of battery packs 110, 120, 130, and 140 may be replaceable. That is, at least one of the plurality of battery cells 111, 112, 113, and 114 in the at least one battery pack 110, 120, 130, and 140 may be determined as the deteriorated battery cell by the apparatus for detecting the deteriorated battery cell according to the present invention, and the battery pack including the deteriorated battery cell may be determined as a deteriorated battery pack, and the corresponding battery pack may be replaced with another battery pack.

2. Measurement Unit

The measurement unit 200 may be provided to measure a state of the battery 100. The measurement unit 200 measures the state such as a voltage, a current, and a temperature of the battery 100. To this end, the measurement unit 200 may include a voltage sensor 210 that measures the voltage, a current sensor 220 that measures the current, and a temperature sensor 230 that measures the temperature. In this case, the measurement unit 200 may measure states such as the current and the voltage of the battery pack and battery cell. That is, it may measure the state of each of the plurality of battery cells or may measure the state of the battery pack in which a plurality of battery cells are bundled together. To this end, the measurement unit 200 may include a plurality of sensors. That is, it may include at least one voltage sensor 210, at least one current sensor 220 and at least one temperature sensor 230. The voltage sensor 210, the current sensor 220, and the temperature sensor 230 periodically measure the voltage, current, and temperature of the battery 100 and provide them to the estimation unit 300. The measurement result may be provided to the estimation unit 300 as an analog signal or a digital signal. The voltage sensor 210 measures the voltage applied between a positive electrode and a negative electrode of the battery 100. As an example, the voltage sensor 210 may include a differential amplifier circuit outputting a voltage signal corresponding to a voltage difference between the positive and negative terminals of the battery 100. Here, the voltage sensor 210 may measure a voltage every second to calculate a maximum value VMax of voltage, a minimum value VMin of voltage, and an average value VAvg of voltage. Of course, the voltage sensor 210 may further include a voltage calculation unit (not illustrated) that measures the voltage of the battery 100 and calculates the maximum value VMax of voltage, the minimum value VMin of voltage, and the average value VAvg of voltage from the measured voltage every second. In this case, the voltage calculation unit may be included in the measurement unit 200 or may be implemented in a predetermined module form in a region other than the measurement unit 200. In addition, the current sensor 220 is a sense resistor or Hall sensor and generates a signal corresponding to magnitude of a charging current. The current sensor 220 may measure magnitude of the charging current as well as magnitude of the discharging current. Here, the current sensor 220 may measure the AC current of the battery 100. The temperature sensor 230 may be, for example, a thermocoupler used for temperature measurement. The temperature sensor 230 generates a signal corresponding to the temperature of the battery 100 and provides it to the estimation unit 300.

The measurement unit measures and calculates the maximum values, the minimum values, and the average value of multiple cell voltages, and in the case of the battery pack, it can also calculate the maximum value, the minimum value, and the average value of each module voltage. The measurement unit may be a battery management system BMS, and it is obvious to those skilled in the art that when measuring each cell voltage and calculating each module voltage, the voltages can be measured and calculated together with an identification number of each cell and an identification number of each module. The measurement unit may measure the current of the battery pack in order to determine whether or not to perform charging and to measure the section during diagnosis, which will be described later.

3. Estimation Unit

The estimation unit 300 estimates the SOH of the battery 100. In this case, the estimation unit 300 estimates the SOH of the battery 100 using the state data such as the voltage, the current, and the temperature of the battery 100 measured by the measurement unit 200. The SOH can be estimated in various ways. For example, the SOC may be calculated while fully discharging the battery 100 from a fully charged state to a fully discharged state or fully charging the battery 100 from the fully discharged state, and the SOH of the battery pack may be calculated by comparing the calculated SOC with reference charging capacity of the battery 100. Here, the SOC may be estimated using an open circuit voltage OCV of the battery 100. That is, the SOC may be estimated by extracting an SOC matching the OCV measured by the measurement unit 200 by referring to an initial OCV table stored in the storage unit 700. In addition, the SOC may be estimated by measuring the impedance of the battery 100. In addition, the SOC of battery may be estimated by using measurement data after charging and discharging of the battery 100, respectively. As another method of estimating the SOH, the SOH of the battery 100 may be estimated based on the measured charging time after measuring the current temperature of the battery 100 and measuring the charging time in a predetermined voltage range of the battery 100. In this case, the SOH matching the temperature and charging time measured in a SOH table by temperature-charge time already stored in the storage unit 700 may be detected, and the detected SOH may be estimated as the current SOH of the battery 100.

4. Diagnosis Setting Unit

The diagnosis setting unit 400 sets a diagnosis start condition and a diagnosis section of the deteriorated battery cell according to the SOH of the battery 100, and sets a determination condition of the deteriorated battery cell according to the SOH of the battery 100. That is, the the charging DOD is the difference between a charging end SOC and a charging start SOC (i.e., (charging end SOC-charging start SOC)). In this case, in the storage unit 700, the section of the SOH set by the diagnosis start condition setting unit 410 and the first and second start conditions of the corresponding charging section are stored in a table form. In addition, the diagnosis start condition setting unit 410 sets the first start condition and the second start condition of the discharge section according to the SOH. The first start condition of the discharging section may be a case of discharging for a discharging operation time DIAG-_START_DCHG_DURATION or more, and the second start condition of the discharging section may be a case of discharging for a discharging DIAG_START_DCHG_DOD or more. Here, the discharging operation time is the time from the start of discharging to the end of discharging, and the discharging DOD is the difference between a discharging end SOC and a discharging start SOC (i.e., (discharging start SOC-discharging end SOC)). In this case, in the storage unit 700, the section of the SOH and the first and second start conditions of the corresponding discharging section are stored in a table form. [Table 1] illustrates an example of a diagnosis start condition table of the deteriorated battery cell. Referring to [Table 1], for example, when the SOH is approximately 100% to 90%, as a discharge diagnosis start condition, the discharging operation time is approximately 3 hours and the discharging DOD is approximately 70, and as a charging diagnosis start condition, the charging operating time is approximately 3 hours and the charging DOD is approximately 80.

TABLE 1

| battery SOH | discharging diagnosis condition | | charging diagnosis condition | |
|---|---|---|---|---|
| | discharging operation time (Hour)(discharging start – discharging end) | discharging DOD(discharging start SOC – discharging end SOC) | charging operation time (Hour)(charging start – charging end) | charging DOD(charging start SOC – charging end SOC) |
| 100~90% | 3 | 70 | 3 | 80 |
| 90~80% | 2 | 60 | 2 | 70 |
| 80~70% | 1 | 50 | 1 | 60 |
| 70~60% | 1 | 40 | 1 | 50 |
| 60~0% | 0.5 | 30 | 0.5 | 30 | diagnosis setting unit 400 may include a diagnosis start condition setting unit 410 that sets the diagnosis start condition according to the SOH of the battery 100, a diagnosis section setting unit 420 that sets the diagnosis section of the deteriorated battery cell, and a deterioration condition setting unit 430 that sets the deterioration determination condition of the deteriorated battery according to the SOH of the battery 100. The diagnosis setting unit 400 performs a diagnosis operation of the deteriorated battery cell only when charging/discharging satisfies a predetermined condition in order to reduce an unnecessary computation amount.

4.1 Diagnosis Start Condition Setting Unit

The diagnosis start condition setting unit 410 sets a first start condition and a second start condition of a charging section according to the SOH. The first start condition of the charging section may be a case of charging for a charging operation time DIAG_START_CHG_DURATION or more, and the second start condition of the charging section may be a case of charging a charging DOD DIAG_START_CH-G_DOD or more. Here, the charging operation time is the time from the start of charging to the end of charging, and 4.2. Diagnosis Section Setting Unit The diagnosis section setting unit 420 sets a diagnosis section according to the current of the battery 100. In this case, the diagnosis section setting unit 420 sets it as a charging end time point (T_chg_end) and a discharging end time point (T_Dchg_end) when the measured current value is less than or equal to a predetermined current limit value. In this case, the current limit value during charging may be greater than the current limit value during discharging. In addition, the diagnosis section setting unit 420 may set a time for a predetermined set value (user set value) from the charging and discharging end time points T_chg_end and T_Dchg_end as the charging and discharging detection section reference values DIAG_CHG_TIME and DIAG_D-CHG_TIME. That is, it may set a time from the charging end time point to the charge detection time reference value time point after the end of charging as the charging detection section reference value DIAG_CHG_TIME and set a time from the discharging end time point to the discharge detection time reference value time point after the end of discharging as the discharging detection section reference value DIAG_DCHG_TIME. For example, the difference for approximately 5 minutes from the charging end time point can be calculated and set as the charging detection section reference value DIAG_CHG_TIME, and the difference for approximately 10 minutes from the discharging end time point can be calculated and set as the discharging detection section reference value DIAG_DCHG_TIME.

4.3. Deterioration Condition Setting Unit

The deterioration condition setting unit 430 may set the deterioration determination condition of the deteriorated battery cell by using the maximum value VMax of voltage, the minimum value VMin of voltage, and the average value VAvg of voltage obtained during the diagnosis section. The deterioration determination condition may be set differently depending on the SOH of the battery. To this end, the deterioration condition setting unit 430 sets the first diagnosis reference value DIAG_AVG_MIN and the second diagnosis reference value DIAG_MAX_AVG in the charging detection section reference value DIAG_CHG_TIME and the discharging detection section reference value DIAG_DCHG_TIME. Here, the first diagnosis reference value DIAG_AVG_MIN (i.e., (VAvg−VMin)) is the difference between the average voltage VAvg in the module and the minimum voltage VMin in the module, and the second diagnosis reference value DIAG_MAX_AVG (i.e., (VMax−VAvg)) is the difference between the maximum voltage VMax in the module and the average voltage VAvg in the module. [Table 2] illustrates an example of a deterioration condition table by the battery lifespan. Referring to [Table 2], for example, when the SOH of the battery is approximately 100% to 90%, the first diagnosis reference value DIAG_AVG_MIN is approximately 0.05 V and the second diagnosis reference value DIAG_MAX_AVG is approximately 0.03 V of the discharging end time point. In addition, when the SOH of the battery is approximately 100% to 90%, and the first diagnosis reference value DIAG_AVG_MIN is approximately 0.02 V and the second diagnosis reference value DIAG_MAX_AVG is approximately 0.05 V of the charging end time point. Meanwhile, the deterioration determination reference table may be updated, after it is set during product production, by acquiring data of a battery user and considering the same or similar product group, application, and usage pattern. In this way, the determination reference of deteriorated battery cell considered when designing the battery may create an optimal condition by analyzing usage data of a customer. The analysis method may utilize artificial intelligence or statistical techniques such as machine learning and deep learning.

5. Diagnosis Performance Decision Unit

The diagnosis performance decision unit 500 determines whether or not a detection diagnosis start condition of the deteriorated battery cell after the end of charging/discharging of the battery. In this case, the diagnosis performance decision unit 500 determines whether or not the diagnosis start condition for detecting the deteriorated battery cell is satisfied after the end of charging/discharging according to the diagnosis start condition set by the diagnosis start condition setting unit 410. As described above, the diagnosis start condition setting unit 410 sets the first start condition and the second start condition of the charging and discharging section according to the SOH.

The diagnosis performance decision unit 500 obtains the SOH from the estimation unit 300, determines whether or not the set first and second start conditions are satisfied, and decides whether or not to perform the diagnosis. That is, the diagnosis performance decision unit 500 decides to perform the diagnosis when it is charged for a charging operation time DIAG_START_CHG_DURATION or more or charged for a charging DOD DIAG_START_CHG_DOD or more in the charging section. In addition, the diagnosis performance decision unit 500 decides to perform the diagnosis when when it is discharged for a discharging operation time DIAG_START_DCHG_DURATION or more or discharged for a discharging DOD DIAG_START_DCHG_DOD or more in the the discharging section.

6. Deterioration Determination Unit

The deterioration determination unit 600 determines the deteriorated battery cell by comparing the measured value in the diagnosis section and the set value after the end of charging/discharging after it is determined to perform the diagnosis. The deterioration determination unit 600 may determine the deteriorated battery cell using the maximum value VMax of voltage, the minimum value VMin of voltage, and the average value VAvg of voltage measured every second by a voltage measurement unit 210 of the measurement unit 200. Since it is difficult to determine that a battery cell is deteriorated simply because a voltage difference occurs between the battery cells, a diagnostic value is set in consideration of the lifespan of the battery in the present invention. That is, in the present invention, regardless of the period, the maximum value VMax of voltage, the minimum value VMin of voltage, and the average value VAvg of voltage of all battery cells in the battery 100 are measured and calculated every second for each charging, discharging, and stop (standby) section, and are compared with a dete-

TABLE 2

| battery SOH | discharging end time point | | charging end time point | |
| | first diagnosis reference valueDIAG_AVG_MIN | second diagnosis reference valueDIAG_MAX_AVG | first diagnosis reference valueDIAG_AVG_MIN | second diagnosis reference valueDIAG_MAX_AVG |
|---|---|---|---|---|
| 100~90% | 0.05 V | 0.03 V | 0.02 V | 0.05 V |
| 90~80% | 0.1 V | 0.05 V | 0.05 V | 0.1 V |
| 80~70% | 0.2 V | 0.1 V | 0.1 V | 0.2 V |
| 70~60% | 0.5 V | 0.2 V | 0.2 V | 0.5 V |
| 60~50% | 0.6 V | 0.3 V | 0.3 V | 0.6 V |
| 50~40% | 0.6 V | 0.3 V | 0.3 V | 0.6 V |
| 40~30% | 0.6 V | 0.3 V | 0.3 V | 0.6 V |
| 30~20% | 0.6 V | 0.3 V | 0.3 V | 0.6 V |
| 20~0% | 0.6 V | 0.3 V | 0.3 V | 0.6 V | rioration determination set value (deterioration determination condition) to determine the deteriorated battery cell. First, the deterioration determination unit 600 calculates a voltage difference in the set diagnosis section, compares it with the first diagnosis reference value DIAG_AVG_MIN and the second diagnosis reference value DIAG_MAX_AVG set by the deterioration condition setting unit, and determines that it is the deteriorated battery cell when the voltage difference is greater than the first and second diagnosis reference voltages.

In this case, as the voltage difference, a cell voltage difference between modules constituting the battery pack or a voltage difference between cells in each module may be applied. For the detection of the charging/discharging/stop (standby) section, in the case of an ESS system in which a plurality of modules composed of a plurality of cells form each battery rack, a measured current value per rack is utilized.

Here, the first diagnosis reference value DIAG_AVG_MIN is the difference (i.e., (VAvg−VMin)) between the average voltage VAvg within the module and the minimum voltage VMin within the module, and the second diagnosis reference value DIAG_MAX_AVG is the difference (i.e., (VMax−VAvg)) between the maximum voltage VMax within the module and the average voltage VAvg within the module. In addition, the battery module or pack including the deteriorated battery cell may be determined as a deteriorated battery module or pack.

7. Storage Unit

The storage unit 700 may store various data for managing the battery 100. For example, the storage unit 700 may store data such as the type of battery 100, the voltage and current for charging/discharging, and the corresponding SOC, the SOH, and SOP. Accordingly, the charging and discharging of the battery 100 may be controlled using the data of the storage unit 700. In addition, the storage unit 600 may store various data for the operation of the apparatus for detecting the deteriorated battery cell according to the present invention. That is, the storage unit 700 may store the diagnosis start condition set by the diagnosis start condition setting unit 410, the diagnosis section of the deteriorated battery cell set by the diagnosis section setting unit 420, and the deterioration determination condition of the deteriorated battery cell set by the deterioration condition setting unit 430. For example, as illustrated in [Table 1] and [Table 2], the storage unit 700 may store deteriorated battery cell diagnosis start conditions and deteriorated battery cell determination conditions for each SOH section in a table form. As the storage unit 700, non-volatile memories such as a flash memory, electrically erasable programmable read-only memory (EEPROM), static RAM (SRAM), ferro-electric RAM (FRAM), phase-change RAM (PRAM), magnetic RAM (MRAM), etc. may be used.

Figure 3:
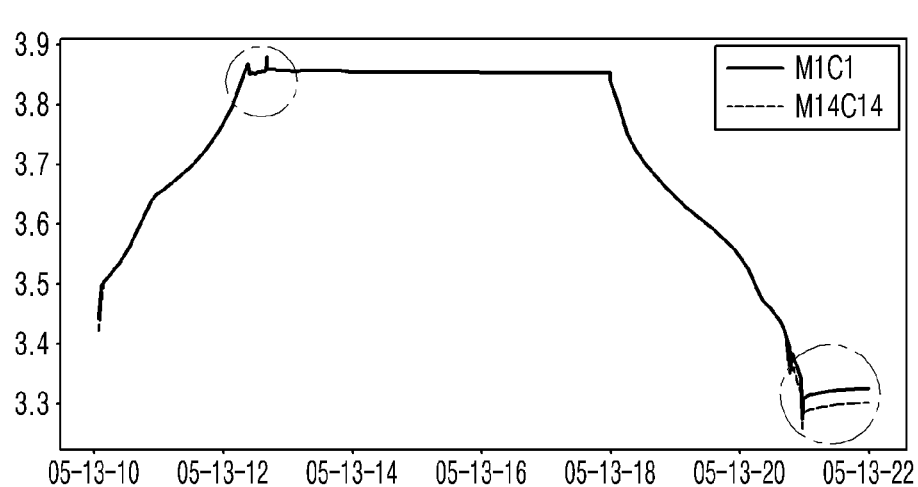
FIG. 3 is a graph illustrating a charging/discharging pattern of a battery.

As described above, the apparatus for detecting the deteriorated battery cell according to the embodiment of the present invention detects the deteriorated battery cell using data at the end time point of charging and discharging. In this case, in the present invention, the deteriorated battery cell is detected by paying attention to the phenomenon in which the voltage difference increases at the charging and discharging end time points. This will be described with reference to FIGS. 4 and 5 as follows. FIG. 3 is a graph illustrating a charging/discharging pattern of a battery, wherein a vertical axis represents voltage and a horizontal axis represents time. In this case, the horizontal axis representing time represents the date and time, and FIG. 3 illustrates a voltage change from 10:00 to 22:00 on May 13.

Figure 4:
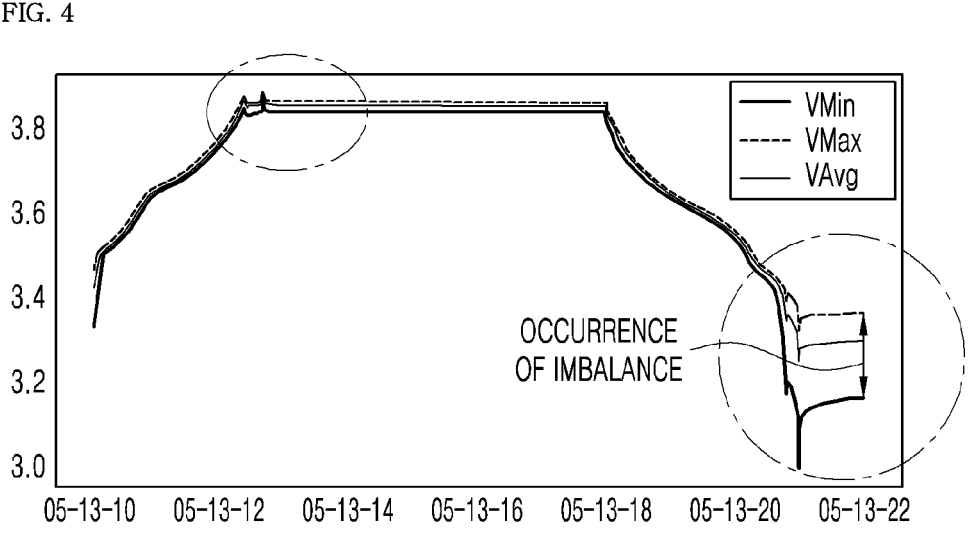
FIG. 4 is a graph illustrating a maximum value, a minimum value, and an average value of voltage according to the charging/discharging pattern of the battery.
Figure 5:
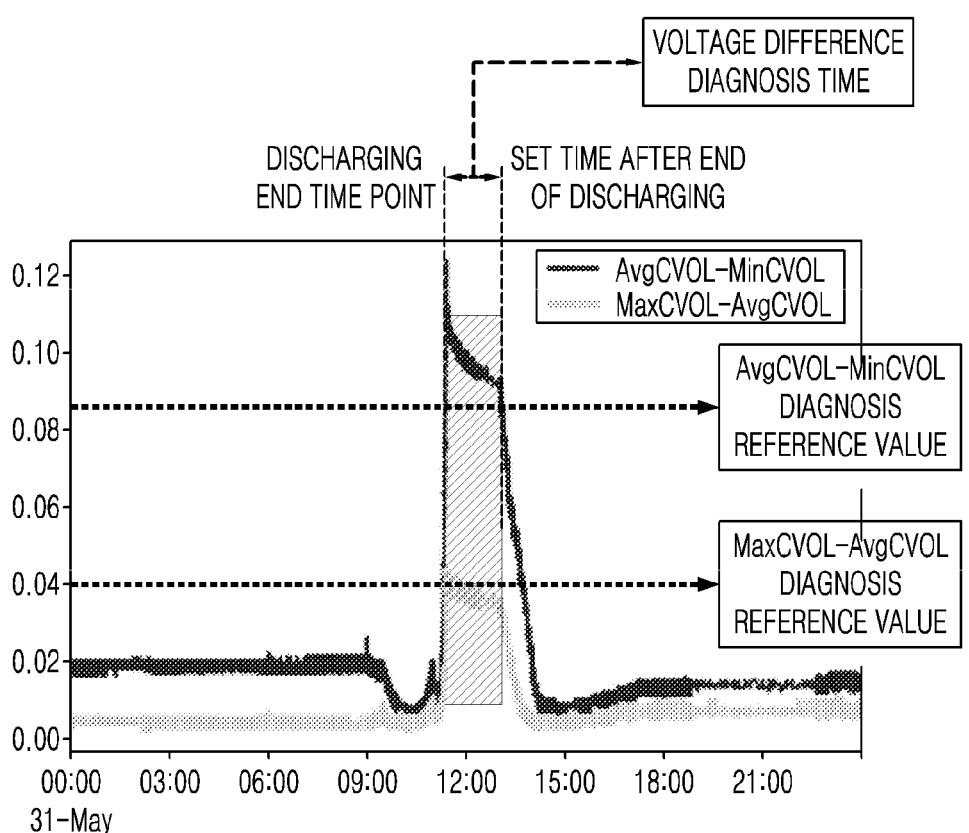
FIG. 5 is a graph illustrating differences between the maximum value, the average value, and the minimum value of the voltage near a discharging end time point of the battery.

In addition, the graph illustrates a voltage change according to the date and time of a first battery cell M1C1 of a first battery module and a fourteenth battery cell M14C14 of a fourteenth battery module. As illustrated in FIG. 3, it can be seen that the voltage difference increases depending on the battery module and the cell at the end of charging and discharging, that is, at the end time point. FIG. 4 is a graph illustrating the maximum value VMax of voltage, the minimum value VMin of voltage, and the average value VAvg of voltage according to the charging/discharging pattern of the battery. In FIG. 4, as in FIG. 3, the vertical axis represents voltage and the horizontal axis represents date and time. Referring to FIG. 4, as in FIG. 3, since the voltage difference increases at the end time point of charging and discharging, the difference between the maximum value VMax of voltage, the minimum value VMin of voltage, and the average value VAvg of voltage also increases accordingly. FIG. 5 is a graph illustrating the difference (VMax−VAvg) between the maximum value of voltage and the average value of voltage and the difference (VAvg−VMin) between the average value of voltage and minimum value of voltage according to the charging/discharging patterns of the battery. As in FIGS. 3 and 4, the vertical axis represents voltage and the horizontal axis represents date and time. As illustrated in FIG. 5, since the voltage difference increases at the end time point of charging and discharging, the difference between the maximum value of voltage, the average value of voltage, and the minimum value of voltage also increases. Therefore, in the present invention, the deteriorated battery cell is detected by paying attention to the phenomenon in which the voltage difference increases at the charging and discharging end time points. That is, in the present invention, the deteriorated battery cell is determined by detecting the charging/discharging end section and comparing the measured value in the charging/discharging end period and the set value. This can solve the problem that the prior literature in which statistics are produced for all measured values and all measured values are compared on a daily/monthly/yearly basis does not sufficiently reflect the voltage change during the calculation period. In addition, in the present invention, voltage imbalance between modules or battery cells in a battery pack can be diagnosed by comparing the voltage difference between the cells in a module, and the relative degree of deterioration of the cells in the module can be diagnosed by comparing the difference (VMax−VAvg) between the maximum value of voltage and the average value of voltage and the difference between the average value of voltage and the minimum value of voltage (VAvg−VMin). In addition, by diagnosing the battery only when the battery satisfies a specific use condition, the computation for detecting the deteriorated cell can be minimized.

Figure 6:
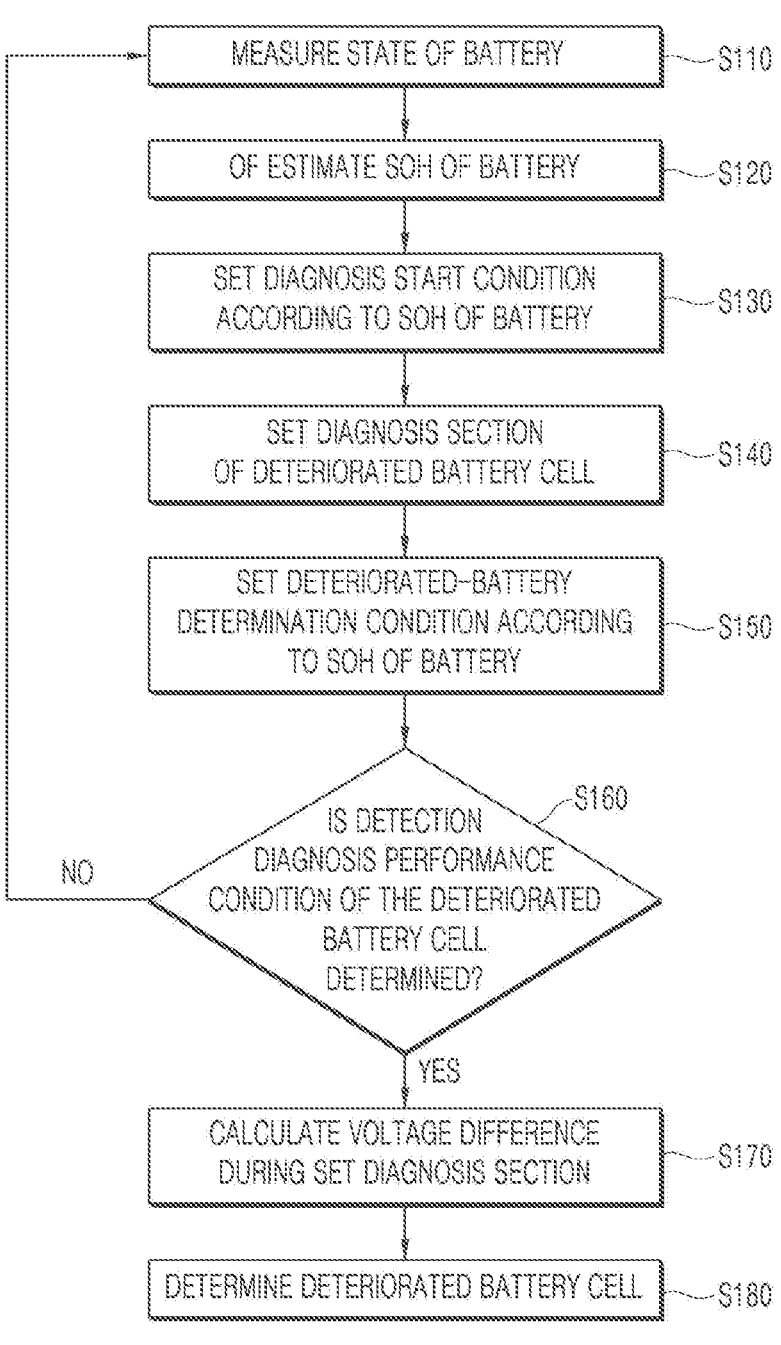
FIG. 6 is a flowchart illustrating a method for detecting a deteriorated battery cell according to an embodiment of the present invention.
Figure 7:
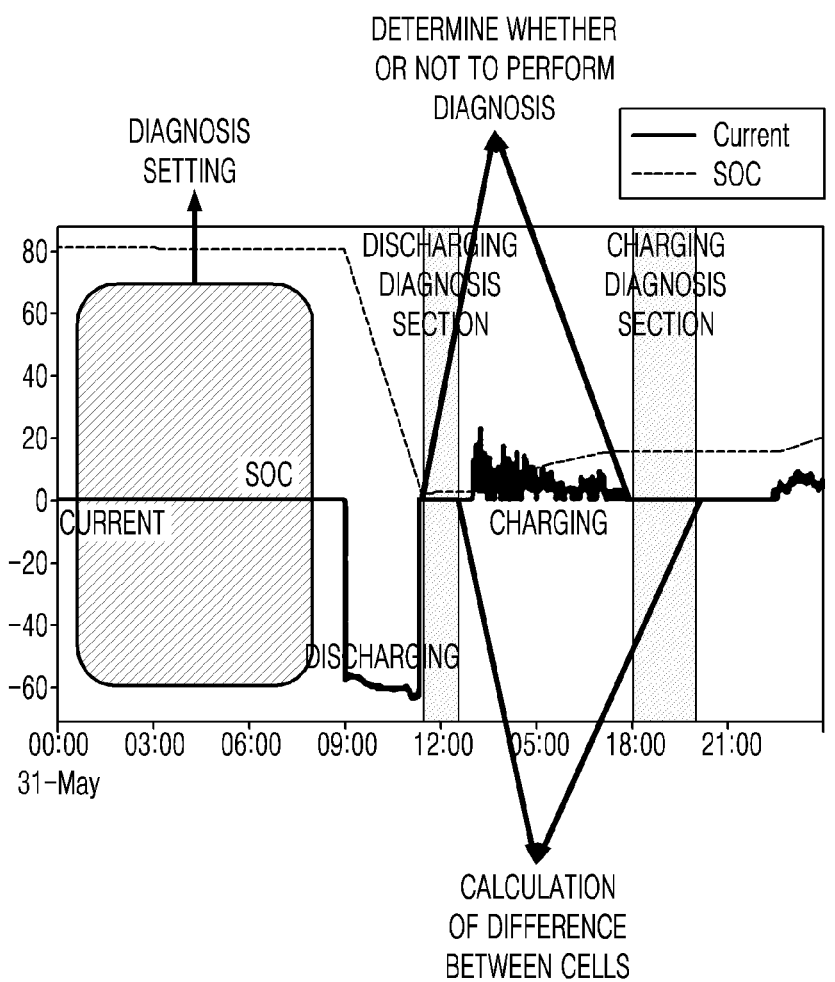
FIG. 7 is a graph illustrating a current over time according to charging/discharging of the battery for further describing the method for detecting the deteriorated battery cell.

FIG. 6 is a flowchart illustrating a method for detecting the deteriorated battery cell according to an embodiment of the present invention. In addition, FIG. 7 is a graph illustrating a current over time according to charging/discharging of the battery for further describing the method for detecting the deteriorated battery cell. That is, FIG. 7 is a graph illustrating the current and SOC of the battery according to time, and is a graph illustrating the current and SOC of the battery according to charging/discharging of the battery.

Referring to FIG. 6, a method for detecting a deteriorated battery cell according to an embodiment of the present invention may include a process of measuring a state such as a voltage, current, temperature, etc. of the battery 100 S110, a process of estimating SOH of the battery using a state measurement value of the battery 100 S120, a process of setting a diagnosis start condition according to the SOH of the battery 100 S130, a process of setting a diagnosis section of the deteriorated battery cell S140, a process of setting a determination condition of the deteriorated battery according to the SOH of the battery 100 S150, a process of determining a detection diagnosis performance condition of the deteriorated battery cell S160, a process of calculating a voltage difference during the set diagnosis section S170, and a process of determining the deteriorated battery cell by comparing a measurement value at the charging/discharging end section with a set value S180.

That is, as illustrated in FIG. 7, when a current does not flow, that is, in a state in which charging/discharging does not proceed, the diagnosis start condition is set (e.g.: between 00:00 and 09:00 on the X-axis of the graph in FIG. 7) according to the SOH of the battery 100, and this is discharging and charging diagnosis section for a predetermined time after the end of discharging and charging. In addition, it is determined whether or not to perform the diagnosis after the end of discharging and charging (11:30, 18:00), and the cell voltage difference is calculated at the end time point of the discharge diagnosis section and the end time point of the charge diagnosis section (12:30, 20:00). In addition, the battery pack including the deteriorated battery cell may be determined as a deteriorated battery pack, and the deteriorated battery pack may be replaced with a normal battery pack. The method for detecting the deteriorated battery cell according to an embodiment of the present invention, that is, a method for driving the apparatus for detecting the deteriorated battery cell according to an embodiment of the present invention will be described in more detail for each process.

S110: The state of the battery 100 is measured using the measurement unit 200. The measurement unit 200 measures the state such as a voltage, a current, and a temperature of the battery 100. To this end, the measurement unit 200 may include a voltage sensor 210 that measures the voltage, a current sensor 220 that measures the current, and a temperature sensor 230 that measures the temperature. In this case, the measurement unit 200 may measure states such as the current and the voltage of the battery pack and battery cell. That is, it may measure the state of each of the plurality of battery cells or may measure the state of the battery pack in which a plurality of battery cells are bundled together. The voltage sensor 210, the current sensor 220, and the temperature sensor 230 periodically measure the voltage, current, and temperature of the battery 100 and provide them to the estimation unit 300. The voltage sensor 210 measures the voltage applied between a positive electrode and a negative electrode of the battery 100. As an example, the voltage sensor 210 may include a differential amplifier circuit outputting a voltage signal corresponding to a voltage difference between the positive and negative terminals of the battery 100. In addition, the current sensor 220 is a sense resistor or Hall sensor and generates a signal corresponding to magnitude of a charging current. The current sensor 220 may measure magnitude of the charging current as well as magnitude of the discharging current. The temperature sensor 230 may be, for example, a thermocoupler used for temperature measurement. The temperature sensor 230 generates a signal corresponding to the temperature of the battery 100 and provides it to the estimation unit 300.

S120: The SOH of the battery 100 is estimated using the estimator 300. In this case, the estimation unit 300 estimates the SOH of the battery 100 using the state data such as the voltage, the current, and the temperature of the battery 100 measured by the measurement unit 200. The SOH can be estimated in various ways. For example, the SOC may be calculated while fully discharging the battery 100 from a fully charged state to a fully discharged state or fully charging the battery 100 from the fully discharged state, and the SOH of the battery pack may be calculated by comparing the calculated SOC with reference charging capacity of the battery 100. Here, the SOC may be estimated using an open circuit voltage OCV of the battery 100. That is, the SOC may be estimated by extracting an SOC matching the OCV measured by the measurement unit 200 by referring to an initial OCV table stored in the storage unit 600. In addition, the SOC may be estimated by measuring the impedance of the battery 100. In addition, the SOC of battery may be estimated by using measurement data after charging and discharging of the battery 100, respectively. As another method of estimating the SOH, the SOH of the battery 100 may be estimated based on the measured charging time after measuring the current temperature of the battery 100 and measuring the charging time in a predetermined voltage range of the battery 100. In this case, the SOH matching the temperature and charging time measured in a SOH table by temperature-charge time already stored in the storage unit 700 may be detected, and the detected SOH may be estimated as the current SOH of the battery 100.

S130: A diagnosis start condition of the deteriorating battery cell is set according to the SOH of the battery 100 using the diagnosis start condition setting unit 410. That is, the diagnosis start condition setting unit 410 sets the diagnosis start condition of the deteriorated battery cell according to the SOH of the battery 100 during charging and discharging estimated by the estimator 300. The diagnosis start condition setting unit 410 sets a first start condition and a second start condition of a charging section according to the SOH. The first start condition of the charging section may be a case of charging for a charging operation time DIAG_START_CHG_DURATION or more, and the second start condition of the charging section may be a case of charging a charging DOD DIAG START_CHG_DOD or more. Here, the charging operation time is the time from the start of charging to the end of charging, and the charging DOD is the difference between a charging end SOC and a charging start SOC (i.e., (charging end SOC-charging start SOC)). In this case, in the storage unit 700, the section of the SOH set by the diagnosis start condition setting unit 410 and the first and second start conditions of the corresponding charging section are stored in a table form. In addition, the diagnosis start condition setting unit 410 sets the first start condition and the second start condition of the discharge section according to the SOH. The first start condition of the discharging section may be a case of discharging for a discharging operation time DIAG_START_DCHG_DURATION or more, and the second start condition of the discharging section may be a case of discharging for a discharging DIAG_START_DCHG_DOD or more. Here, the discharging operation time is the time from the start of discharging to the end of discharging, and the discharging DOD is the difference between a discharging end SOC and a discharging start SOC (i.e., (discharging start SOC-discharging end SOC)). In this case, in the storage unit 700, the section of the SOH and the first and second start conditions of the corresponding discharging section are stored in a table form.

S140: The diagnosis section of the deteriorated battery cell is set. The diagnosis section setting unit 420 sets a diagnosis section according to the current of the battery 100. In this case, the diagnosis section setting unit 420 sets it as a charging end time point (T_chg_end) and a discharging end time point (T_Dchg_end) when the measured current value is less than or equal to a predetermined current limit value. In addition, the diagnosis section setting unit 420 may set a time for a predetermined set value (user set value) from the charging and discharging end time points T_chg_end and T_Dchg_end as the charging and discharging detection section reference values DIAG_CHG_TIME and DIAG_DCHG_TIME. That is, it may set a time from the charging end time point to the charge detection time reference value time point after the end of charging as the charging detection section reference value DIAG_CHG_TIME and set a time from the discharging end time point to the discharge detection time reference value time point after the end of discharging as the discharging detection section reference value DIAG_DCHG_TIME. For example, the difference for approximately 5 minutes from the charging end time point can be calculated and set as the charging detection section reference value DIAG_CHG_TIME, and the difference for approximately 10 minutes from the discharging end time point can be calculated and set as the discharging detection section reference value DIAG_DCHG_TIME.

S150: A determination condition of the deteriorating battery cell is set depending on the SOH of the battery 100. That is, the deterioration condition setting unit 430 may set the deterioration determination condition of the deteriorated battery cell by using the maximum value VMax of voltage, the minimum value VMin of voltage, and the average value VAvg of voltage calculated during the diagnosis section. To this end, the deterioration condition setting unit 430 sets the first diagnosis reference value DIAG_AVG_MIN and the second diagnosis reference value DIAG_MAX_AVG in the charging detection section reference value DIAG_CHG_TIME and the discharging detection section reference value DIAG_DCHG_TIME. Here, the first diagnosis reference value DIAG_AVG_MIN (i.e., (VAvg–VMin)) is the difference between the average voltage VAvg in the module and the minimum voltage VMin in the module, and the second diagnosis reference value DIAG_MAX_AVG (i.e., (VMax–VAvg)) is the difference between the maximum voltage VMax in the module and the average voltage VAvg in the module.

S160: It is determined whether or not a detection diagnosis start condition of the deteriorated battery cell is satisfied. That is, the diagnosis performance decision unit 500 determines whether or not not the detection diagnosis start condition of the deteriorated battery cell after the end of charging/discharging of the battery. In this case, the diagnosis performance decision unit 500 determines whether or not the diagnosis start condition for detecting the deteriorated battery cell is satisfied after the end of charging/discharging according to the diagnosis start condition set by the diagnosis start condition setting unit 410. As described above, the diagnosis start condition setting unit 410 sets the first start condition and the second start condition of the charging and discharging section according to the SOH. The diagnosis performance decision unit 500 obtains the SOH from the estimation unit 300, searches the storage unit 700 to determine whether or not the set first and second start conditions are satisfied, and decides whether or not to perform the diagnosis. That is, the diagnosis performance decision unit 500 decides to perform the diagnosis when it is charged for a charging operation time DIAG_START_CHG_DURATION or more or charged for a charging DOD DIAG_START_CHG_DOD or more in the charging section. In addition, the diagnosis performance decision unit 500 decides to perform the diagnosis when when it is discharged for a discharging operation time DIAG_START_DCHG_DURATION or more or discharged for a discharging DOD DIAG_START_DCHG_DOD or more in the the discharging section. On the other hand, if it is less than or equal to the above range in the charging and discharging section, the above processes are repeated from the battery state measurement process S110.

S170: When it is determined that diagnosis is to be performed from the diagnosis execution decision unit 500, a voltage difference is calculated during a set diagnosis section. The deterioration determination unit 600 may calculate the maximum value VMax of voltage, the minimum value VMin of voltage, and the average value VAvg of voltage from the voltage measured every second by the voltage measurement unit 210 of the measurement unit 200. Since it is difficult to determine that a battery cell is deteriorated simply because a voltage difference occurs between the battery cells, a diagnostic value is set in consideration of the lifespan of the battery in the present invention. That is, in the present invention, regardless of the period, the maximum value VMax of voltage, the minimum value VMin of voltage, and the average value VAvg of voltage of all battery cells in the battery 100 are calculated every second for each charging, discharging, and stop (standby) section.

S180: A voltage difference in the diagnosis section is calculated and compared with the deterioration determination condition to determine the deteriorated battery cell. The deterioration determination unit 600 may determine the deteriorated battery cell by comparing the maximum value VMax of voltage, the minimum value VMin of voltage, and the average value VAvg of voltage with a set value. First, when the voltage difference between the charging detection section reference value DIAG_CHG_TIME and the discharging detection section reference value DIAG_DCHG_TIME is greater than the first diagnosis reference value DIAG_AVG_MIN and the second diagnosis reference value DIAG_MAX_AVG, it is determined as the deteriorated battery cell. Here, the first diagnosis reference value DIAG_AVG_MIN is the difference between the average voltage VAvg within the module and the minimum voltage VMin within the module (i.e., (Avg–VMin)), and the second diagnosis reference value DIAG_MAX_AVG is the difference between the maximum voltage VMax in the module and the average voltage VAvg within the module (i.e., (VMax–VAvg)).

Meanwhile, when a predetermined battery cell is determined to be a deteriorated battery cell, a battery pack including the deteriorated battery cell may be determined as a deteriorated battery pack. Also, the deteriorated battery pack may be replaced with a normal battery pack.

Although the technical spirit of the present invention as described above has been specifically described according to the above embodiments, it should be noted that the above embodiments are for description thereof and not for limitation. In addition, those skilled in the art will understand that various embodiments are possible within the scope of the technical idea of the present invention.

The symbols and their names used in the drawings of this invention are as follows.

100: battery
200: measurement unit
300: estimation unit
400: diagnosis setting unit
500: diagnosis performance decision unit
600: deterioration determination unit
700: storage unit

What is claimed is:

1. An apparatus for detecting a deteriorated battery cell, the apparatus comprising:

a measurement unit that measures a state of a battery;

an estimation unit that estimates a state of health (SOH) of the battery;

a diagnosis setting unit that sets a diagnosis start condition, a diagnosis section, and a deterioration determination condition of the deteriorated battery cell according to the SOH of the battery;

a diagnosis performance decision unit that decides whether or not to perform a diagnosis by determining whether or not the diagnosis start condition of the deteriorated battery cell is satisfied after an end of charging and discharging of the battery; and a deterioration determination unit that determines the deteriorated battery cell by calculating a voltage difference in the diagnosis section after the end of the charging and discharging and comparing the voltage difference with the deterioration determination condition, wherein the diagnosis setting unit comprises:

a diagnosis start condition setting unit that sets the diagnosis start condition of the deteriorated battery cell according to the SOH of the battery, a diagnosis section setting unit that sets the diagnosis section of the deteriorated battery cell, and a deterioration condition setting unit that sets the deterioration determination condition of the deteriorated battery cell according to the SOH of the battery, wherein the diagnosis section setting unit sets the diagnosis section by:

setting a charging end time point and a discharging end time point when a current measurement value is less than or equal to a predetermined current limit time, setting a time for a predetermined set value from the charging end time point as a charging detection section reference value, and setting the time for the predetermined set value from the discharging end time point as a discharging detection section reference value, wherein the diagnosis start condition setting unit sets a first and second start conditions of charging and discharging sections according to the SOH of the battery, wherein the first start condition of the charging section is charging for a charging operation time or more, the second start condition thereof is charging for a charging depth of discharge (DOD) or more, and wherein the first start condition of the discharging section is discharging for a discharging operation time or more, and the second start condition is discharging for a discharging depth of discharge (DOD) or more.

2. The apparatus of claim 1, further comprising a storage unit that stores data including the diagnosis start condition, the diagnosis section, and the deterioration determination condition of the deteriorated battery cell is further included.

3. The apparatus of claim 1, wherein the deterioration condition setting unit sets the deterioration determination condition of the deteriorated battery cell using a maximum value VMax of voltage, a minimum value VMin of voltage, and an average value VAvg of voltage calculated during the diagnosis section.

4. The apparatus of claim 3, wherein the deterioration condition setting unit sets first and second diagnosis reference values in a charging detection section reference value and a discharging detection section reference value, the first diagnosis reference value is a difference (VAvg-VMin) between the average voltage VAvg within a module and the minimum voltage VMin within the module, and the second diagnosis reference value is a difference (VMax-VAvg) between the maximum voltage VMax within the module and the average voltage VAvg within the module.

5. The apparatus of claim 4, wherein the diagnosis performance decision unit decides to perform the diagnosis when it is charged for the charging operation time or more or charged for the charging DOD or more in the charging section, and decides to perform the diagnosis when it is discharged for the discharging operation time or more or the discharging DOD or more in the discharging section.

6. The apparatus of claim 5, wherein the deterioration determination unit determines the corresponding battery call as the deteriorated battery cell when the voltage difference in the charging detection section reference value is greater than the difference between the average value VAvg of voltage within the battery and the minimum value VMin of voltage within the battery or greater than the difference between the maximum value VMax of voltage within the battery and the average value VAvg of voltage within the battery.

7. The apparatus of claim 6, wherein the deterioration determination unit determines the corresponding battery cell as the deteriorated battery cell when the voltage difference in the discharging detection section reference value is greater than the difference between the average value VAvg of voltage within the module and the minimum value VMin of voltage within the module and or greater than the difference between the maximum value VMax of voltage within the module and the average value VAvg of voltage within the module.

8. A method for detecting a deteriorated battery cell, the method comprising:

a process of measuring a state of a battery;

a process of estimating a state of health (SOH) of the battery;

a process of setting a diagnosis start condition, a diagnosis section, and a deterioration determination condition of the deteriorated battery cell according to the SOH of the battery;

a process of determining a detection diagnosis performance condition of the deteriorated battery cell and deciding not to perform a diagnosis when the diagnosis start condition of the deteriorated battery cell is not satisfied to avoid unnecessary diagnosis;

a process, by a deterioration determination unit, of determining the deteriorated battery cell by calculating a voltage difference in the diagnosis section and comparing the voltage difference with the deterioration determination condition;

a process of replacing the battery having the deteriorated battery cell determined as deteriorated with a normal battery; and a process of controlling charging and discharging of the normal battery using data of a storage unit after the battery having the deteriorated battery cell determined as deteriorated is replaced with the normal battery, wherein in the process of setting the diagnosis start condition of the battery, first and second start conditions of charging and discharging sections are set according to the SOH of the battery, the first start condition of the charging section is charging for a charging operation time or more, the second start condition thereof is charging for a charging depth of discharge (DOD) or more, and the first start condition of the discharging section is discharging for a discharging operation time or more, and the second start condition is discharging for a discharging depth of discharge (DOD) or more.

9. The method of claim 8, further comprising:

a process of storing data including the diagnosis start condition, the diagnosis section, and the deterioration determination condition of the deteriorated battery cell; and a process of storing updates of the data including the diagnosis start condition, the diagnosis section, and the deterioration determination condition of the deteriorated battery cell by acquiring usage data of a battery user and based on same or similar product group, application, and usage pattern of the battery user, and analyzing the usage data using at least one of artificial intelligence, machine learning and deep learning.

10. The method of claim 8, wherein in the process of setting the diagnosis section, when a current measurement value is less than or equal to a predetermined current limit value, a charging detection time reference value time point after the end of charging from a charging end time point is set as a charging detection reference value and a discharging detection time reference value time point after the end of discharging from a discharging end time point is set as a discharging detection reference value.

11. The method of claim 10, wherein in the process of setting the deterioration condition, first and second diagnosis reference values are set in a charging detection section reference value and a discharging detection section reference value, the first diagnosis reference value is a difference (VAvg-VMin) between an average voltage VAvg within a module and a minimum voltage VMin within the module, and the second diagnosis reference value is a difference (VMax-VAvg) between a maximum voltage VMax within the module and the average voltage VAvg within the module.

12. The method of claim 11, wherein in the process of determining the detection diagnosis performance condition, it is decided to perform the diagnosis when it is charged for the charging operation time or more or charged for the charging DOD or more in the charging section, and it is decided to perform the diagnosis when it is discharged for the discharging operation time or more or the discharging DOD or more in the discharging section.

13. The method of claim 12, wherein in the process of determining the deteriorated battery cell, the corresponding battery cell is determined as the deteriorated battery cell when the voltage difference in the charging detection reference value is greater than the difference between the average voltage VAvg within the module and the minimum voltage VMin within the module or greater than the difference between the maximum voltage VMax within the module and the average voltage VAvg within the module.

14. The method of claim 13, wherein in the process of determining the deteriorated battery cell, the corresponding battery cell is determined as the deteriorated battery cell when the voltage difference in the discharging detection reference value is greater than the difference between the average voltage VAvg within the module and the minimum voltage VMin within the module or greater than the difference between the maximum voltage VMax within the module and the average voltage VAvg within the module.

15. The apparatus of claim 1, wherein the diagnosis start condition is set in a state in which charging or discharging is not occurring.

16. The apparatus of claim 1, wherein the diagnosis section includes a discharge diagnosis section and a charge diagnosis section, wherein the discharge diagnosis section occurs after the end of the discharging, and the charge diagnosis section occurs after the charging, and wherein whether or not to perform the diagnosis occurs at a start of the discharge diagnosis section and at a start of the charge diagnosis section.

17. The method of claim 8, wherein the diagnosis start condition is set in a state in which charging or discharging is not occurring.

18. The method of claim 8, wherein the diagnosis section includes a discharge diagnosis section and a charge diagnosis section, wherein the discharge diagnosis section occurs after an end of the discharging, and the charge diagnosis section occurs after the charging, and wherein whether or not to perform the diagnosis occurs at a start of the discharge diagnosis section and at a start of the charge diagnosis section.

\* \* \* \* \*